(12) United States Patent
Gu

(10) Patent No.: US 9,871,016 B2
(45) Date of Patent: Jan. 16, 2018

(54) SEMICONDUCTOR PACKAGE

(71) Applicant: Samsung Electronics Co., Ltd., Suwon-si, Gyeonggi-do (KR)

(72) Inventor: Liqun Gu, Suzhou (CN)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/222,933

(22) Filed: Jul. 28, 2016

(65) Prior Publication Data

US 2017/0033025 A1   Feb. 2, 2017

(30) Foreign Application Priority Data

Jul. 29, 2015   (CN) .......................... 2015 1 0454059
Dec. 11, 2015  (KR) ........................ 10-2015-0177360

(51) Int. Cl.
*H01L 23/00*        (2006.01)
*H01L 23/492*       (2006.01)
(Continued)

(52) U.S. Cl.
CPC ............ *H01L 24/97* (2013.01); *H01L 23/492* (2013.01); *H01L 23/552* (2013.01); *H01L 23/562* (2013.01); *H01L 25/0655* (2013.01); *H01L 21/561* (2013.01); *H01L 21/565* (2013.01); *H01L 23/295* (2013.01); *H01L 23/3128* (2013.01); *H01L 24/06* (2013.01); *H01L 24/13* (2013.01); *H01L 24/16* (2013.01); *H01L 24/32* (2013.01); *H01L 24/45* (2013.01); *H01L 24/48* (2013.01); *H01L 24/49* (2013.01); *H01L 24/73* (2013.01); *H01L 24/85* (2013.01); *H01L 24/92* (2013.01); *H01L 2224/0401* (2013.01); *H01L 2224/04042* (2013.01); (Continued)

(58) Field of Classification Search
CPC ..... H01L 24/97; H01L 23/552; H01L 23/562; H01L 23/492; H01L 25/0655; H01L 2924/181; H01L 23/295; H01L 23/3128; H01L 2924/3511; H01L 24/06; H01L 24/13; H01L 24/16; H01L 24/32; H01L 24/45; H01L 24/48; H01L 24/49; H01L 24/73; H01L 24/85; H01L 24/92; H01L 2224/0401; H01L 2224/04042
USPC ......................................... 257/659, 660, 787
See application file for complete search history.

(56) References Cited

U.S. PATENT DOCUMENTS 5,166,772 A * 11/1992 Soldner ............... H01L 23/3121
                                                            174/366
5,309,321 A    5/1994 Olla et al.
(Continued)

FOREIGN PATENT DOCUMENTS

CN    101558490 A    10/2009
JP    2003008309 A    1/2003
(Continued)

*Primary Examiner* — Shouxiang Hu
(74) *Attorney, Agent, or Firm* — Renaissance IP Law Group LLP

(57) ABSTRACT

Provided is a semiconductor package including a substrate; at least one semiconductor chip mounted on the substrate; a molding element, which is arranged on the substrate and encapsulates the at least one semiconductor chip; and a lattice element, which is arranged inside the molding element, where the lattice element includes a body having a plurality of openings.

18 Claims, 20 Drawing Sheets

(51) Int. Cl.
*H01L 25/065* (2006.01)
*H01L 23/552* (2006.01)
*H01L 23/29* (2006.01)
*H01L 23/31* (2006.01)
*H01L 21/56* (2006.01)

(52) U.S. Cl.
CPC ............ *H01L 2224/06135* (2013.01); *H01L 2224/131* (2013.01); *H01L 2224/16227* (2013.01); *H01L 2224/32225* (2013.01); *H01L 2224/45124* (2013.01); *H01L 2224/45144* (2013.01); *H01L 2224/4847* (2013.01); *H01L 2224/48091* (2013.01); *H01L 2224/48227* (2013.01); *H01L 2224/48463* (2013.01); *H01L 2224/49175* (2013.01); *H01L 2224/73265* (2013.01); *H01L 2224/85203* (2013.01); *H01L 2224/85205* (2013.01); *H01L 2224/85207* (2013.01); *H01L 2224/92247* (2013.01); *H01L 2224/97* (2013.01); *H01L 2924/1431* (2013.01); *H01L 2924/1434* (2013.01); *H01L 2924/15311* (2013.01); *H01L 2924/181* (2013.01); *H01L 2924/3511* (2013.01)

(56) References Cited

U.S. PATENT DOCUMENTS

| | | | |
|---|---|---|---|
| 6,707,168 B1* | 3/2004 | Hoffman | H01L 23/3128 174/359 |
| 7,480,153 B2* | 1/2009 | Kong | H05K 1/0218 361/760 |
| 7,700,411 B2 | 4/2010 | Yang et al. | |
| 7,787,250 B2* | 8/2010 | Li | H01L 23/04 361/715 |
| 8,264,070 B2 | 9/2012 | Tsai et al. | |
| 8,592,958 B2 | 11/2013 | Ko et al. | |
| 2009/0014847 A1 | 1/2009 | Chen et al. | |
| 2014/0017843 A1 | 1/2014 | Jung et al. | |
| 2015/0070865 A1* | 3/2015 | Yew | H05K 1/11 361/783 |

FOREIGN PATENT DOCUMENTS

| | | |
|---|---|---|
| JP | 2005217221 A | 8/2005 |
| KR | 101088086 B1 | 11/2011 |

* cited by examiner

SEMICONDUCTOR PACKAGE

CROSS-REFERENCE TO RELATED APPLICATIONS

This application claims the benefit of State Intellectual Property Office (SIPO) of the People's Republic of China No. 201510454059.2, filed on Jul. 29, 2015, in State Intellectual Property Office (SIPO) of the People's Republic of China and Korean Patent Application No. 10-2015-0177360, filed on Dec. 11, 2015, in the Korean Intellectual Property Office, the disclosures of which are incorporated herein in their entirety by reference.

BACKGROUND

The inventive concept relates to a semiconductor package, and more particularly, to a semiconductor package capable of reducing warpage of a package substrate.

Recently, with the rapid increase in the demand for portable electronic devices, there has been a corresponding increase in the demand to reduce the size and weight of those devices. To reduce the size and weight of the portable electronic devices, not only is it important to reduce the sizes of individual components, but also to more efficiently integrate a plurality of individual elements into a single package. As the size and weight of a semiconductor package are reduced, a thickness of the semiconductor package also needs to be reduced.

SUMMARY

The inventive concept provides a thin semiconductor package with sufficient reliability.

According to an aspect of the inventive concept, there is provided a semiconductor package including a substrate; at least one semiconductor chip mounted on the substrate; a molding element, which is arranged on the substrate and encapsulates the semiconductor chip; and a lattice element, which is arranged inside the molding element, wherein the lattice element includes a body having a plurality of openings.

According to some embodiments, the lattice element further includes a plurality of supports extending from the substrate to the body, and the supports fixing the body.

According to some embodiments, the lattice element is arranged of a conductive material, and the supports are electrically connected to the substrate.

According to some embodiments, the plurality of openings are defined by first and second ribs, the first ribs and the second ribs substantially perpendicularly intersect with each other, and the supports and the body contact each other substantially perpendicularly.

According to some embodiments, at least one opening exists in an area between adjacent supports.

According to some embodiments, the area of each of the opening is smaller than the area of the top surface of the semiconductor chip.

According to some embodiments, the mechanical strength of the lattice element is greater than the mechanical strength of the molding element.

According to some embodiments, a distance between the top surface of the substrate to the body is greater than a distance between the top surface of the substrate to the semiconductor chip.

According to another aspect of the inventive concept, there is provided a semiconductor package including a substrate; at least one semiconductor chip mounted on the substrate; a molding element, which is arranged on the substrate and encapsulates the semiconductor chip; and a lattice element, which is arranged inside the molding element, wherein the lattice element includes a plurality of bodies, each body including a plurality of openings; and a plurality of supports supporting the body.

According to some embodiments, the plurality of bodies comprise a first body and a second body. The first and the second body are spaced apart from each other and are substantially parallel to the substrate.

According to some embodiments, the openings of the first body and the openings of the second body are alternately arranged.

According to some embodiments, the lattice element further includes a connector for connecting the first body and the second body to each other, and the connector is arranged along a direction that is substantially perpendicular to a direction in which the plurality of bodies are arranged.

According to some embodiments, the openings of the first screen layer and the second screen layer have substantially the same size.

According to some embodiments, the at least one support exists between the semiconductor chips adjacent to each other.

According to some embodiments, the supports contact the plurality of bodies, where a level from the substrate at which the supports contact corresponding ones of the plurality of bodies is higher than the top surface of the semiconductor chip.

In some embodiments, a semiconductor package comprises a substrate; at least one semiconductor chip mounted on the substrate; a molding element encapsulating the at least one semiconductor chip; and one or more plates having openings extending therethrough being disposed inside the molding element, the one or more plates overlying the at least one semiconductor chip; and a plurality of supports extending between the substrate and the one or more plates to support the one or more plates.

In some embodiments, the molding element is divided into a plurality of blocks each disposed within the openings.

In some embodiments, the one or more plates comprise a first plate having first openings and a second plate having second openings, wherein the first and second openings are alternately arranged.

In some embodiments, the first and second openings are offset from each other.

In some embodiments, the first openings are arranged in a first checkerboard pattern and the second openings are arranged in a second checkerboard-type pattern, and the first checkerboard pattern is offset from the second checkerboard-type pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
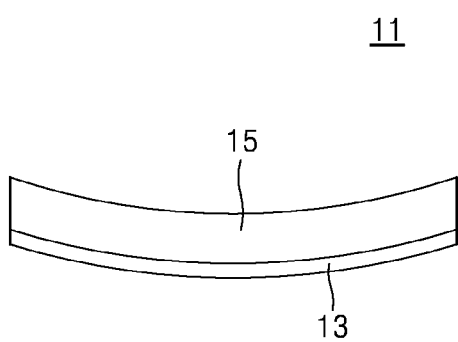
FIGS. 1A and 1B are a schematic diagram of a semiconductor package according to a comparative embodiment.

As used herein, the term "and/or" includes any and all combinations of one or more of the associated listed items. Expressions such as "at least one of", when preceding a list of elements, modify the entire list of elements and do not modify the individual elements of the list.

Hereinafter, the inventive concept will be described more fully with reference to the accompanying drawings, in which exemplary embodiments of the inventive concept are shown. This inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. In the drawings, lengths and sizes of layers and regions may be exaggerated for clarity.

In the case where a position relationship between two items are described with the terms "on ~," "on the top of ~," or the like, one or more items may be interposed therebetween unless the term "directly" is used in the expression.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs.

Unless otherwise defined, a vertical direction or a horizontal direction refers to a direction that is vertical or horizontal to a main surface of a package substrate. Furthermore, unless otherwise defined, the top surface of a component stacked on a package substrate refers to a surface opposite to the package substrate, whereas the bottom surface of the component refers to a surface facing toward the package substrate.

Throughout the present specification, a temperature below a first temperature is used as a synonym of a 'low temperature', whereas a temperature equal to above a second temperature is used as a synonym of a 'high temperature.' Furthermore, a viscosity below a first viscosity is used as a synonym of a 'low viscosity,' whereas a viscosity equal to above a second viscosity is used as a synonym of a 'high viscosity.' The first temperature and the first viscosity may vary according to a first liquid utilized in embodiments.

Hereinafter, embodiments of the inventive concept will be described in detail with reference to the attached drawings.

Figure 1B:
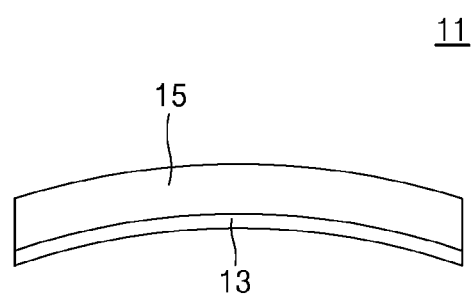

FIGS. 1A and 1B are a schematic diagram of a semiconductor package according to a comparative embodiment.

Referring to FIGS. 1A and 1B, as the respective components in a semiconductor package 11 have different coefficients of thermal expansion (CTEs), the semiconductor package 11 may be warped. The warping phenomenon of the semiconductor package 11 is referred to here as warpage. For example, a second component, such as a molding element 15, is used to encapsulate a semiconductor chip mounted on a first component, such as a substrate 13, and a warpage phenomenon may occur in the semiconductor package 11 due to thermal expansion and thermal contraction of the first component and the second component having different CTEs. The warpage phenomenon may also cause the adverse effects on the semiconductor assembly processes such as a surface mounting process and a package singulation process.

FIGS. 1A and 1B are cross-sectional conceptual views showing warpage of the semiconductor package 11 depending on the structures of the semiconductor package. FIGS. 1A and 1B show states of the semiconductor package 11 after a semiconductor chip is mounted on a surface of the substrate 13 and encapsulated by the molding element 15.

Because the substrate 13 and the molding element 15 are often cured at a high temperature, the substrate 13 and the molding element 15 are substantially heated during curing operations. At the heated temperature, the substrate 13 and the molding element 15 having different CTEs affect each other via thermal expansion and thermal contraction.

FIGS. 1A and 1B are schematic diagrams showing warpages of the semiconductor package 11. If the substrate 13 and the molding element 15 constituting the semiconductor package 11 have different CTEs ("CTE mismatch between the substrate and the molding element"), e.g., the CTE of the molding element 15 is greater than that of the substrate 13, the following occurs. At room temperature, as the molding element 15 having the relatively large CTE contracts, a tensile stress is applied to the substrate 13, and thus the substrate 13 is warped to be convex downward, i.e. concave, as shown in FIG. 1A. At a high temperature, as the molding element 15 having the relatively large CTE expands, a compressive stress is applied to the substrate 13, and thus the substrate 13 is warped to be convex upward as shown in FIG. 1B.

On the contrary, if the CTE of the molding element 15 is smaller than that of the substrate 13, the following occurs. At room temperature, as the molding element 15 having the relatively small CTE expands, a compressive stress is applied to the substrate 13, and thus the substrate 13 is warped to be convex upward as shown in FIG. 1B. At a high temperature, as the molding element 15 having the relatively small CTE contracts, a tensile stress is applied to the substrate 13, and thus the substrate 13 is warped to be convex downward as shown in FIG. 1A.

In other words, CTE mismatch between the molding element 15 and the substrate 13 can create stresses within the semiconductor package, leading to warpage of the semiconductor package 11. As a result, the substrate 13 becomes uneven, i.e., not flat, and the height of the center portion of the substrate 13 is different from that of the peripheral portion of the substrate 13. Consequently, when the substrate 13 is vacuum-chucked to packaging equipment, the substrate 13 may not be accurately mounted on the packaging equipment, and the substrate 13 may not be fixed to a desired location, thereby causing a process failure and a reduction of the yield.

Furthermore, as semiconductor packages become thinner, the problem of warpage of the semiconductor packages may increase. Therefore, there is an on-going demand for novel ways to reduce or substantially prevent the warpage of a semiconductor package.

Figure 2:
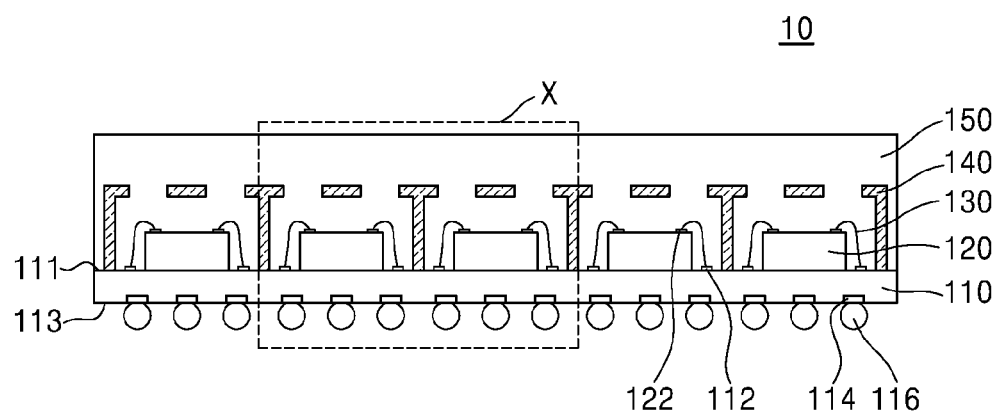
FIG. 2 is a diagram showing a semiconductor package including a lattice element according to an embodiment.

FIG. 2 is a cross-sectional view showing a semiconductor package including a warpage suppressing structure such as a lattice element according to some embodiments.

Referring to FIG. 2, the semiconductor package 10 includes a substrate 110, semiconductor chips 120 mounted on the substrate 110, a molding element 150 arranged on the substrate 110 to encapsulate the semiconductor chip 120, and a lattice element 140 arranged inside the molding element 150.

The substrate 110 of the semiconductor package 10 may be a printed circuit board (PCB). The PCB may be a single-sided PCB or a double-sided PCB and may be a multi-layer PCB including one or more internal wire patterns therein. Furthermore, the PCB may be a rigid PCB or a flexible PCB.

Although not shown, the substrate 110 may include one or more insulation layers and one or more conductive wiring layers. The conductive wiring layer is a circuit pattern arranged on the PCB and may be arranged of aluminium (Al) or copper (Cu), for example. According to some embodiments, surfaces of the conductive wiring layer may be plated with tin (Sn), gold (Au), nickel (Ni), or lead (Pb).

Furthermore, the substrate 110 may have a flat panel-like structure including a top surface 111 and a bottom surface 113 opposite to each other. Conductive pads 112 may be arranged on the top surface 111 of the substrate 110 to be connected to the semiconductor chips 120 and via contacts (not illustrated). In contrast, external connection pads 114 may be arranged on the bottom surface 113 of the substrate 110. The via contacts penetrate through the substrate 110 and interconnect the conductive pads 112 and the external connection pads 114. The conductive pads 112 and the external connection pads 114 may be formed of aluminium (Al) or copper (Cu), for example.

A top surface of the conductive pads 112 may be located at a level higher than the top surface 111 of the substrate 110. However, embodiments are not limited thereto, and the conductive pad 112 may be buried in the substrate 110. Thus, the top surface of the conductive pads 112 may be located at a level equal to or lower than the top surface 111 of the substrate 110.

Furthermore, the substrate 110 may further include a protection layer that exposes the conductive pads 112 and the external connection pads 114 and covers the remaining portion of the top surface of the PCB. Here, the protection layer may be formed of a photo solder resist that may be patterned in a photolithography operation. The protection layer may be arranged as a solder mask define (SMD) layer that partially exposes the external connection pads 114 or a non-solder mask define (NSMD) layer that substantially entirely exposes the conductive pads 112 and the external connection pads 114.

The substrate 110 may contain epoxy resin, polyimide resin, bismaleimide triazine triazine (BT) resin, flame retardant 4 (FR-4), FR-5, ceramic, silicon, glass, photosensitive liquid dielectrics, photosensitive dry film dielectrics, polyimide flexible film thermally cured dry films, the thermally cured liquid dielectrics, resin coated copper foils, thermoplastics, or flexible resin.

On the other hand, the substrate 110 may have a single-layer structure or a multi-layer structure including wire patterns therein. For example, the substrate 110 may be a single rigid flat-panel, may be arranged by a plurality of rigid flat-panels adhered to one another, or may be arranged by adhering thin flexible PCBs to rigid flat-panels. Each of the plurality of rigid flat-panels adhered to one another or PCBs may include a wiring layer pattern. Furthermore, the substrate 110 may be a low temperature co-fired ceramic (LTCC) substrate. The LTCC substrate may include a plurality of stacked ceramic layers stacked therein and may include wire patterns therein.

The plurality of external connection pads 114 are arranged on the bottom surface 113 of the substrate 110, and solder balls 116 may be respectively attached to the plurality of external connection pads 114. The external connection pads 114 may be formed of aluminium (Al) or copper (Cu), for example. According to some embodiments, surfaces of the external connection pads 114 may be plated with tin (Sn), gold (Au), nickel (Ni), or lead (Pb).

The semiconductor chips 120 are mounted on the top surface 111 of the substrate 110. The semiconductor chip 120 may be a semiconductor chip for performing various functions, e.g., a memory, a logic, a microprocessor, an analog element, a digital signal processor, a system-on-chip and so on. Furthermore, the semiconductor chip 120 may be a multi-chip structure in which at least two or more semiconductor chips are stacked. For example, the at least two semiconductor chips may be the same type. Alternatively, one of the at least two or more semiconductor chips may be a memory element, whereas the other one of the at least two or more semiconductor chips may be a micro-controller element.

Figure 10:
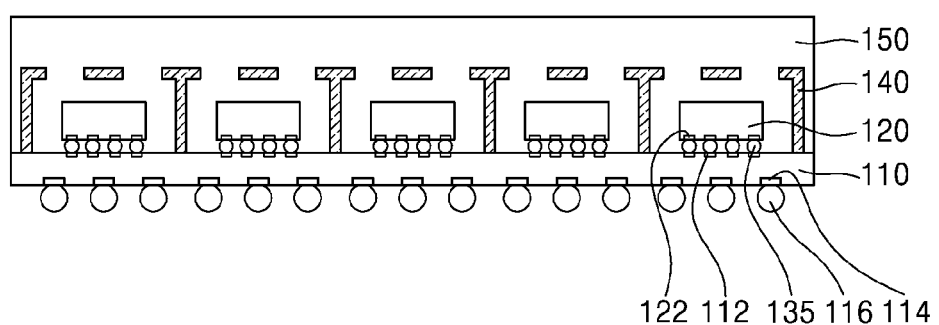
FIG. 10 is a cross-sectional diagram showing a semiconductor package including a lattice element according to an embodiment.

The semiconductor chips 120 may be mounted via wire bonding as shown in FIG. 2 or may be mounted via solder ball bonding (see FIG. 10).

If the semiconductor chip 120 is mounted via wire bonding as in the present embodiment, the semiconductor chip 120 is attached to the top surface of the substrate 110 via an adhesive tape or the like, and the semiconductor chip 120 and the substrate 110 are electrically connected to each other via a bonding wire 130. For example, a first end of the bonding wire 130 may be connected to the conductive pad 112 arranged on the top surface 111 of the substrate 110 and a second end of the bonding wire 130 may be connected to a chip conductive pad 122 arranged on the semiconductor chip 120, thereby electrically interconnecting the semiconductor chip 120 and the substrate 110.

According to some embodiments, the bonding wire 130 may be arranged as a gold (Au) wire or an aluminum (Al) wire, where the bonding wire 130 may have a shape for any one of ball bonding and wedge bonding.

According to some embodiments, the bonding wire 130 may be connected to the conductive pad 112 and the chip conductive pad 122 via any one of thermo-compression connection or ultrasonic connection or may be connected to the conductive pad 112 and the chip conductive pad 122 via a thermo-sonic connection, which is a combination of the thermo-compression connection and the ultrasonic connection.

The molding element 150 encapsulates the semiconductor chip 120 and the bonding wire 130 on the top surface 111 of the substrate 110, thereby protecting the semiconductor chip 120 and the bonding wire 130 from the external environment.

The molding element 150 may be formed by injecting an appropriate amount of a molding resin onto the semiconductor chip 120 in an injecting operation and constitutes the outer portion of the semiconductor package 10 in a curing operation. Depending on the desired applications, the outer portion of the semiconductor package 10 may be formed by applying pressure to the semiconductor chip 120 covered with the molding resin in a pressing operation.

Here, process conditions including a delay time between the injection of the molding resin and the pressing operation, an amount of the injected molding resin, a pressing temperature, and a pressure may be set in consideration of physical properties, such as the viscosity of the molding resin.

According to some embodiments, the molding resin may include an epoxy-group molding resin or a polyimide-group molding resin. For example, the epoxy-group molding resin may be a polycyclic aromatic epoxy resin, a bisphenol-group epoxy resin, a naphthalene-group epoxy resin, an o-cresol novolac epoxy resin, a dicyeclopentadiene epoxy resin, a biphenyl-group epoxy resin, or a phenol novolac epoxy resin.

According to some embodiments, the molding resin may contain carbon black, which is a colorant. On the other hand, the molding resin may not only include carbon black as the colorant, but also include a curing agent, a curing accelerator, a filler, and a frame retardant.

For example, as the curing agent, amine, a polycyclic aromatic phenol resin, a phenol novolac resin, a cresol novolac resin, a dicyeclopentadiene phenol resin, a xylok-group resin, or a naphthalene-group resin may be used.

The curing accelerator is a catalyst for accelerating a curing reaction between the epoxy-group resin and the curing agent and may be a tertiary amine, such as benzyldimethylamine, triethanolamine, triethylenediamine, dimethylaminoethanol, or tri (dimethylaminomethyl) phenol; an imidazole, such as 2-methylimidazole or 2-phenylimidazole; an organic phosphine, such as diphenylphosphine or phenylphosphine; or a tetraphenyl boron salt, such as tetraphenyl phosphonium, triphenyl phosphine, or tetraphenyl borate.

According to some embodiments, the filler may be a silica filler, whereas the fire retardant may be brominated epoxy resin, antimony oxide, or a metal hydrate.

Furthermore, the molding resin may further contain a releasing agent, such as a higher fatty acid, a higher fatty acid metal salt, or an ester-group wax; and a stress reliever, such as a modified silicon oil, silicon powders, or a silicon resin.

The molding resin may have an appropriate viscosity corresponding to a molding condition. For example, the molding resin may be a flowable solid material, such as a gel.

The lattice element 140 may include a body 143 and a plurality of supports 145. The body 143 may be a rigid body. By arranging the lattice element 140 including the plurality of openings inside the molding element 150, the molding element 150 may be divided into a plurality of sections, such as blocks. The lattice element 140 may suppress thermal expansion and thermal contraction of the molding element 15 by providing a rigid open framework or skeletal structure, thereby reducing the stresses generated within the semiconductor package, resulting in a reduction in the warpage of the semiconductor package 10. This structure can serve to resist warpage in several ways, first by providing a stronger or stress-absorbing internal structure it can strengthen the overall semiconductor package to resist warpage. And second, by breaking up the internal molding compound into sections, it can reduce or absorb the stresses that cause warpage.

Furthermore, the lattice element 140 may be formed of a material with superior mechanical strength, e.g., a metal, as compared to the molding element 150, and thus the lattice element 140 may reduce the warpage of the semiconductor package 10. The lattice element 140 is explained in more detail below with reference to FIGS. 3A and 3B.

Figure 3A:
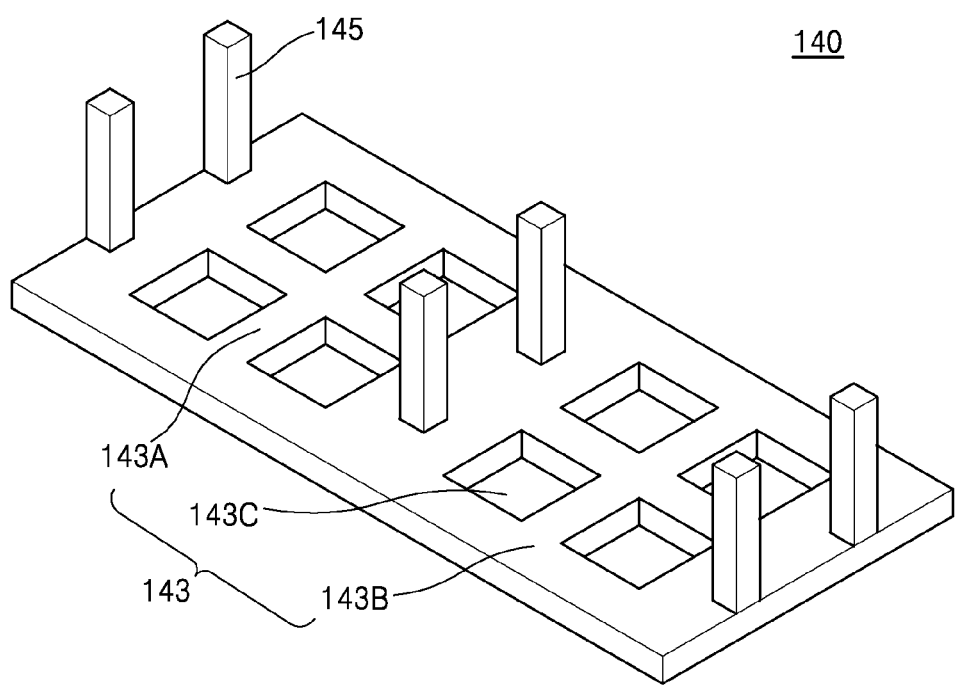
FIGS. 3A and 3B are diagrams each showing a lattice element according to some embodiments.
Figure 3A:
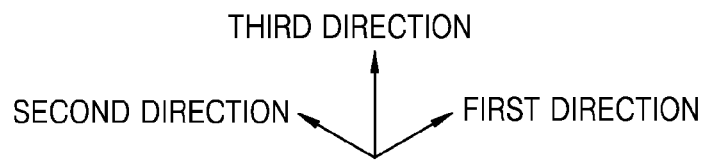
Figure 3B:
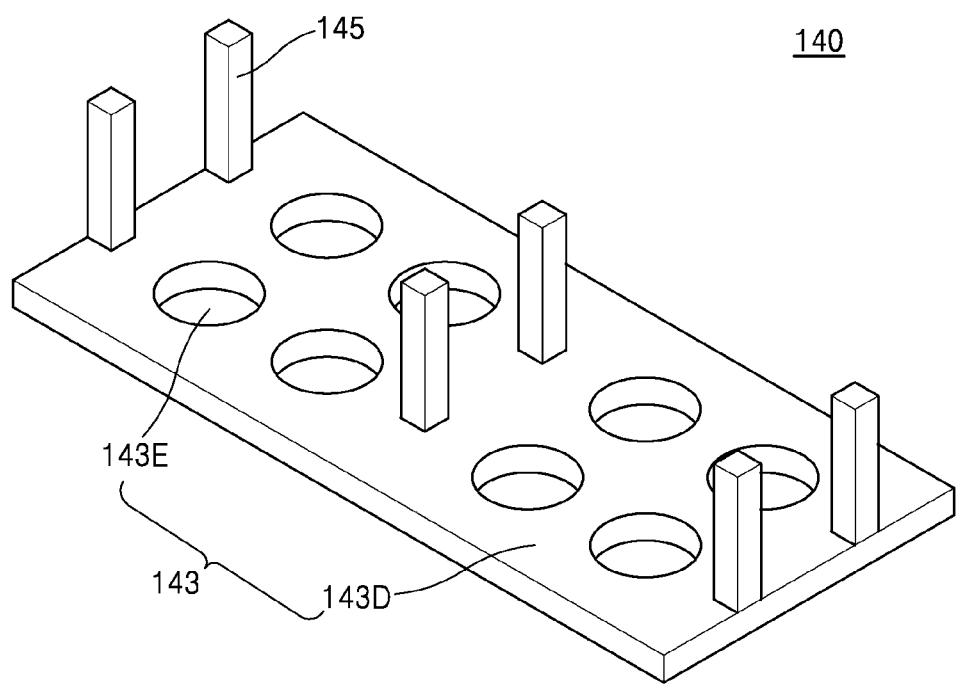
Figure 3B:
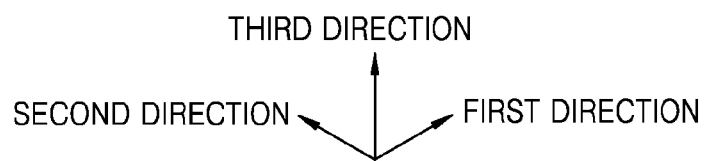

FIGS. 3A and 3B are diagrams each showing the lattice element 140 according to some embodiments.

Referring to FIG. 3A, the lattice element 140 of a semiconductor package indicated by the area X of FIG. 2 may include the body 143 having a plate-like structure (i.e., a plate) with a plurality of openings 143C formed therethrough. The supports 145 may be arranged along the bottom surface of the body 143 to support the body 143 above the substrate 110. The openings 143C may, for example, be square or rectangular-shaped openings arranged between the supports 145 in groups of four. The openings 143C in each group may be separated from each other by first ribs 143A extending in a first direction and second ribs 143B extending in a second direction, where the first and second directions intersect each other at substantially a right angle. Thus, the openings 143C may be defined by the first ribs 143A and the second ribs 143B.

Although the openings 143C in this embodiment are illustrated as being square-shaped, the inventive principles are not limited thereto. For example, the openings may be circular, oval, or any other desired shape. As shown in FIG. 3B, a body 143 having a plate-like structure 143D having circular openings 143E formed therein. Furthermore, the openings need not be arranged in groups of four, but could be arranged having any number of openings (e.g., one or more) in a given group.

The plurality of first ribs 143A may be substantially parallel to one another and may be spaced apart from one another by a substantially equal distance. The first ribs 143A may extend along the first direction. The plurality of second ribs 143B may be substantially parallel to one another and may be spaced apart from one another by a substantially equal distance. The second ribs 143B may extend along the second direction. The first ribs 143A may intersect the second ribs 143B substantially perpendicularly to form the plurality of openings 143C. The supports 145 may extend from the body 143 along a third direction substantially perpendicular to the first direction and the second direction and may be adhered to the first rib 143A and the second ribs 143B of the body 143 to support the body 143. Due to the supports 145, the body 143 may be arranged at a certain location inside the molding element (150, see FIG. 2).

According to an embodiment, the lattice element 140 may be formed of a hard material and/or a conductive material. Therefore, the lattice element 140 may be formed of a material having a hardness greater that that of the molding element 150. The lattice element 140 formed of a conductive material may suppress electromagnetic interference (EMI) after being grounded. The lattice element 140 formed of a hard material may improve the mechanical strength of the semiconductor package 10. Furthermore, the lattice element 140 may be formed of a material with excellent thermal conductivity. If the thermal conductivity of the lattice element 140 is improved, thermal circulation of the semiconductor package 10 may be enhanced.

The lattice element 140 may prevent electromagnetic waves generated by a semiconductor package from being emitted and causing EMI to another electronic component included in an electronic device. Disturbances, such as electromagnetic noises or malfunctions, may occur in an electronic device including a semiconductor package, thereby deteriorating the reliability of the electronic device. For the advanced semiconductor package, that is, a semiconductor package with high response speed and high capacity, EMI due to emission of electromagnetic waves becomes more and more serious. Therefore, the lattice element 140 may suppress electromagnetic waves, which are inevitably generated during operations of a semiconductor package, from adversely affecting other components.

The lattice element 140 may be arranged to be electrically connected to a ground pad of the substrate 110. Therefore, the lattice element 140 may be grounded, thereby reducing EMI.

In other words, the lattice element 140 may not only reduce a warpage that occurs in a semiconductor package, but also suppress EMI.

Figure 4:
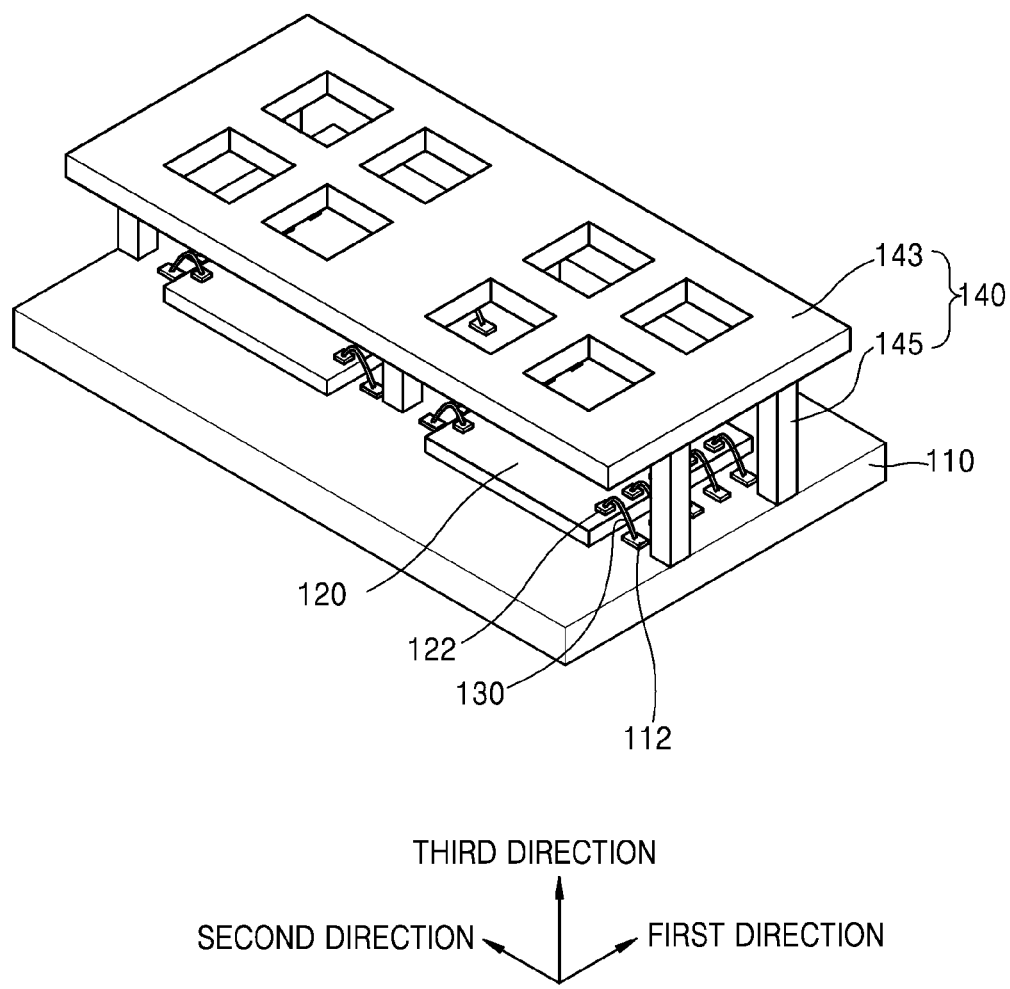
FIG. 4 is a schematic diagram showing a semiconductor package structure including the lattice element, according to an embodiment.

FIG. 4 is a schematic perspective view showing the structure of a semiconductor package including the lattice element 140, according to some embodiments.

Referring to FIG. 4, the area X of FIG. 2 is enlarged to show the structural arrangement of the lattice element 140 on the top surface 111 of the substrate 110 with the semiconductor chips 120 mounted thereon, where the molding element (150 of FIG. 2) is omitted. The lattice element 140 arranged over the semiconductor chip 120 may include the body 143 and the supports 145 as described above. In detail, the supports 145 of the lattice element 140 may contact a ground pad arranged on the top surface 111 of the substrate 110. The body 143 of the lattice element 140 may be fixed at a certain distance above the semiconductor chip 120 by the supports 145. The lattice element 140 may be arranged to contact the ground pad on the substrate 110. Therefore, the lattice element 140 may suppress an EMI if the lattice element 140 is formed of a conductive material.

Furthermore, the distance between the supports 145 adjacent to each other along the second direction may be greater than the length of a side of the semiconductor chip 120 that extends in the second direction. Therefore, the single semiconductor chip 120 may be located between the supports 145 adjacent to each other along the second direction. However, embodiments are not limited thereto. For example, the two or more semiconductor chips 120 may be located between the supports 145 adjacent to each other along the second direction.

In a semiconductor package according to some embodiments, if the conductive pad 112 on the substrate 110 and the chip conductive pad 122 on the semiconductor chip 120 are electrically connected to each other via the bonding wire 130, the semiconductor chip 120 and the conductive pad 112 may be located between the supports 145 adjacent to each other along the second direction.

The height of the support 145, e.g., a distance from the top surface 111 of the substrate 110 to the body 143 along the third direction, may be greater than the thickness of the semiconductor chip 120 along the third direction. However, embodiments are not limited thereto. For example, the supports 145 may have any of various heights as long as the body 143 supported by the supports 145 inside the molding element (150, see FIG. 2) may be arranged.

In some embodiments, if the conductive pad 112 on the substrate 110 and the chip conductive pad 122 on the semiconductor chip 120 are electrically connected to each other via the bonding wire 130, the height of the supports 145 may be selected in consideration of the looping characteristics of the bonding wire 130. In other words, the height of the supports 145 may be selected to prevent the bonding wire 130 and the lattice element 140 from contacting each other.

Figure 5:
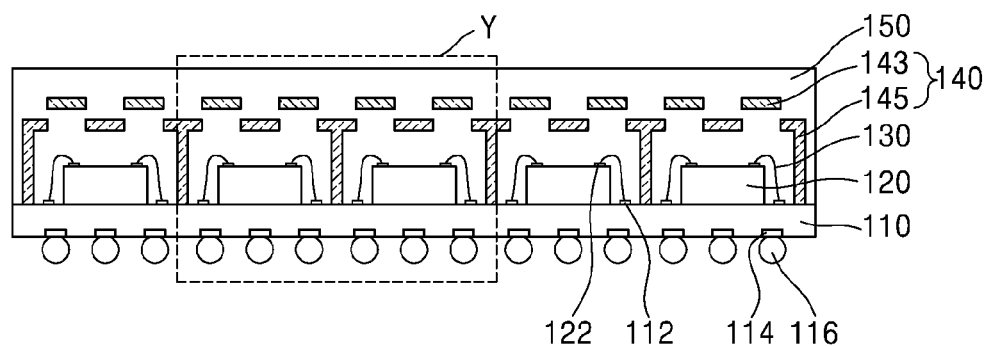
FIG. 5 is a cross-sectional diagram showing a semiconductor package including a lattice element according to an embodiment.

FIG. 5 is a diagram showing a semiconductor package including a lattice element according to an embodiment.

Referring to FIG. 5, a semiconductor package 20 according to some embodiments may include a lattice element 140 including a plurality of bodies 143. Similar to or the same as the semiconductor package 10 described above, the semiconductor package 20 may include the substrate 110, the semiconductor chips 120 arranged on the substrate 110, the molding element 150 for encapsulating the semiconductor chips 120, and the lattice element 140 arranged inside the molding element 150. If the semiconductor chips 120 are connected via wire bonding, the semiconductor chips 120 may be attached to the top surface of the substrate 110 via adhesive tapes or the like, and the semiconductor chips 120 and the substrate 110 are electrically connected to each other via the bonding wires 130. For example, a first end of the bonding wire 130 may be connected to the conductive pad 112 arranged on the top surface 111 of the substrate 110 and a second end of the bonding wire 130 may be connected to a chip conductive pad 122 arranged on the semiconductor chip 120, thereby electrically connecting the semiconductor chip 120 and the substrate 110 to each other. The plurality of external connection pads 114 may be arranged on the bottom surface 113 of the substrate 110. Further, the solder balls 116 may be respectively attached to the plurality of external connection pads 114. Since these components are same as those described above, detailed descriptions thereof will be omitted.

The plurality of bodies 143 may be arranged at different layers and may be arranged substantially parallel to the top surface 111 of the substrate 110. Openings of the bodies 143 arranged at different layers may be alternately arranged in a substantially vertical direction. In other words, the openings in the different layers may be offset from each other such that an opening in one layer overlaps a solid portion of the other layer(s). The plurality of bodies 143 may be arranged to be a certain distance apart from each other. The lattice element 140 may include an appropriate number of bodies 143 to substantially reduce the warpage and EMI of the semiconductor package 20. Although FIG. 5 shows the body 143 including two layers, embodiments are not limited thereto, and the body 143 may include three or more layers.

Figure 6:
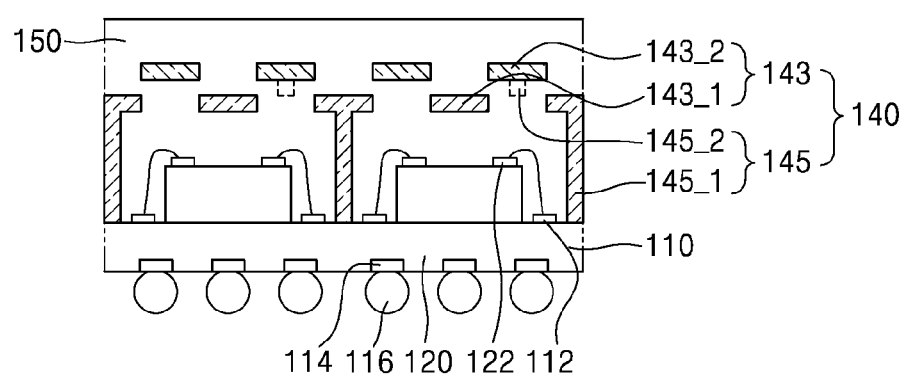
FIG. 6 is an enlarged cross-sectional diagram showing a portion of a semiconductor package including a lattice element according to an embodiment.

FIG. 6 is an enlarged cross-sectional view showing a portion of a semiconductor package including a lattice element according to an embodiment.

As can be seen more clearly in FIG. 6, each of the bodies 143, which provide the different layers of the lattice element 140, may have openings that are alternately arranged with respect to openings in each of the other bodies 143, and the molding element 150 may be arranged as a structure having individual blocks. The molding element 150 is divided into structures having individual blocks to reduce warpage of the semiconductor package 20. The semiconductor package 20 may be arranged, such that the plurality of bodies 143 are connected to one another as a single structure via the supports 145. The plurality of bodies 143 may also be arranged to be a certain distance apart from one another along a direction substantially perpendicular to the top surface of the substrate 110. If the lattice element 140 includes a plurality of bodies 143, the supports 145 may include multiple supports such as a first support 145_1 and a second support 145_2. The first support 145_1 may extend from the top surface 111 of the substrate 110 to a first body 143_1 to support the first body 143_1 above the substrate 110

The second supports 145_2 may be arranged alternately with the first supports 145_1. For example, the second supports 145_2 may extend from a top surface of the first body 143_1 to the second body 143_2. The second body 143_2 may be electrically connected to the first body 143_1 via the second supports 145_2. A sufficient number of second supports 145_2 may be provided for supporting the second body 143_2 above the first body 143_1.

Figure 7A:
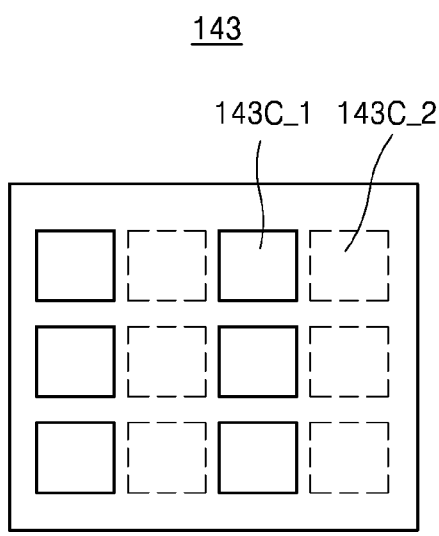
FIGS. 7A and 7B diagrams each showing arrangements of openings of a lattice element according to some embodiments.
Figure 7B:
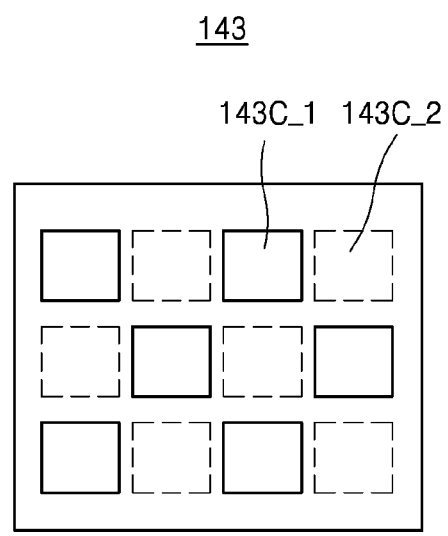

FIGS. 7A and 7B show the lattice-type arrangements of openings in lattice elements of the plurality of bodies 143 (including, for example 143_1 and 143_2 as shown in FIG. 6) in plan view. First and second openings 143C_1 and 143C_2 in first and second bodies 143_1 and 143_2 may be alternately arranged as shown in FIGS. 7A and 7B. More specifically, as shown in FIG. 7A, the first openings 143C_1 formed in the first body 143_1 may be arranged in one or more first columns in plan view, whereas the second openings 143C_2 formed in the second body 143_2 may also be arranged in second columns that are offset from the first columns. Alternatively, as shown in FIG. 7B, the first openings 143C_1 formed in the first body 143_1 may be arranged in a first checkerboard-type pattern. The second openings 143C_2 formed in the second body 143_2 may be arranged in a second checkerboard-type pattern with the second openings 143C_2 offset from the first openings 143C_1.

Since a molding element is generally arranged by injecting a molding resin, which is a flowable solid material, in an injection operation, locations of the openings of the lattice element may be changed according to types of semiconductor packages so as to arrange the molding element without forming an empty space. Although FIGS. 7A and 7B show some embodiments, embodiments are not limited thereto, and the arrangement of the openings may vary.

Figure 8A:
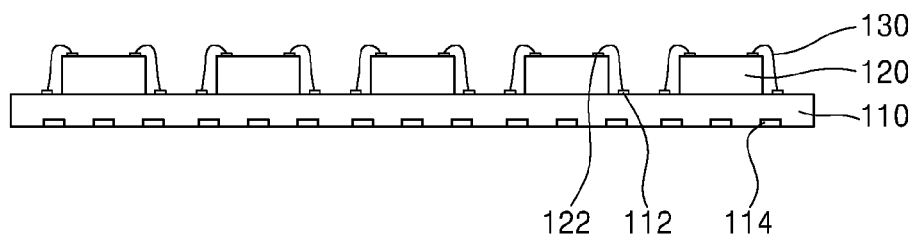
FIGS. 8A through 8C are diagrams for describing a method of fabricating a semiconductor package including a lattice element according to an embodiment.
Figure 8B:
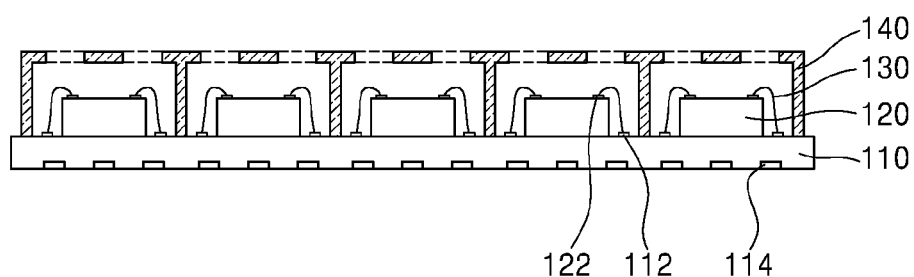
Figure 8C:
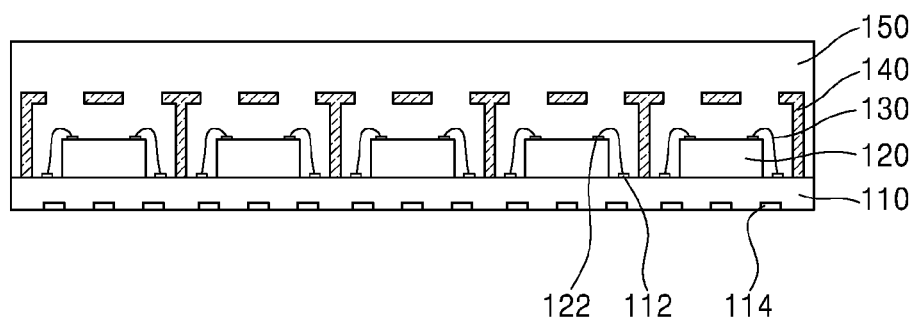

FIGS. 8A through 8C are diagrams for describing a method of fabricating a semiconductor package including a lattice element according to some embodiments.

Referring to FIG. 8A, first, semiconductor chips 120 are mounted on a substrate 110. The semiconductor chips 120 may be electrically connected to conductive wirings formed in the substrate 110, for example, via bonding wires 130. In detail, the semiconductor chips 120 may be mounted on the substrate 110 first. Then, for an electric connection between the semiconductor chips 120 and the substrate 110, conductive pads 112 arranged on the top surface of the substrate 110 and chip conductive pads 122 arranged on the top surface of the semiconductor chips 120 may be connected to each other via the bonding wires 130. External connection pads 114 may be arranged on the bottom surface of the substrate 110.

Referring to FIG. 8B, the lattice element 140 is arranged on the top surface of the substrate 110 having mounted thereon the semiconductor chips 120. The lattice element 140 located on the semiconductor chip 120 may include a body and supports. In detail, the supports of the lattice element 140 may contact the top surface of the substrate 110 having mounted thereon the semiconductor chips 120, whereas the body of the lattice element 140 may be arranged a certain distance from the semiconductor chips 120.

Referring to FIG. 8C, a molding element 150 is formed to cover the top surface 111 of the substrate 110 to encapsulate the semiconductor chips 120 and the lattice element 140. In detail, a molding resin, such as an epoxy resin, is injected using, for example, a transfer molding apparatus, and cured. Solder balls (116, refer to FIG. 2) are attached to the external connection pads 114 arranged on the bottom surface of the substrate 110, thereby completing the semiconductor package (10, refer to FIG. 2).

Figure 9A:
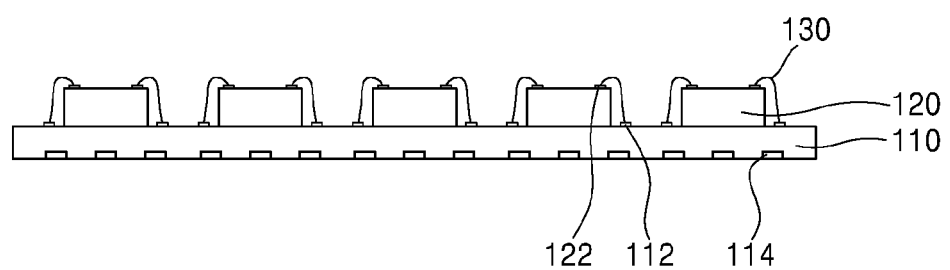
FIGS. 9A through 9C are cross-sectional diagrams for describing a method of fabricating a semiconductor package including a lattice element according to an embodiment.
Figure 9B:
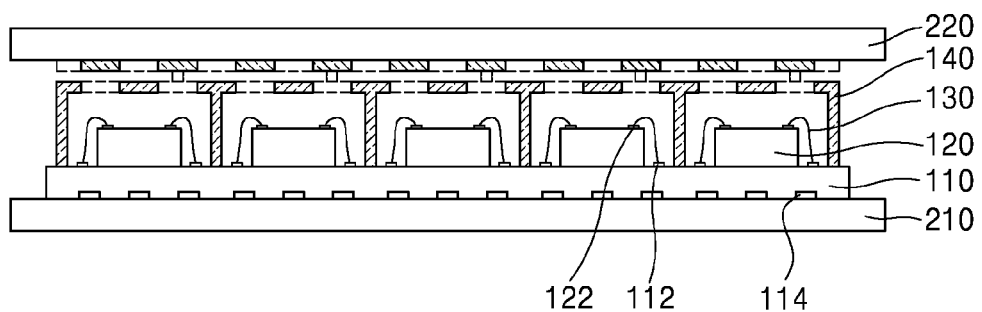
Figure 9C:
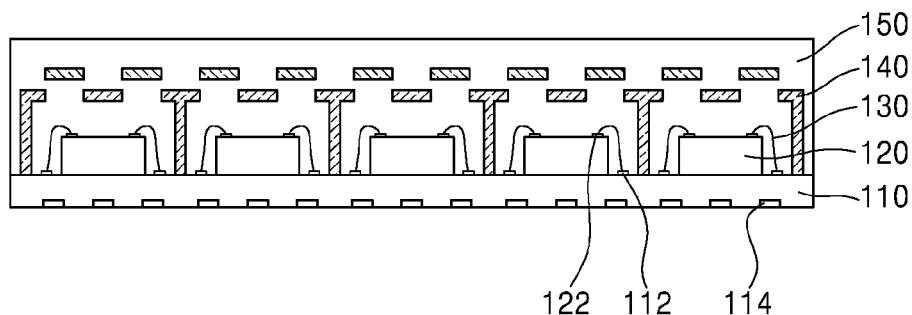

FIGS. 9A through 9C are cross-sectional views for describing a method of fabricating a semiconductor package including a lattice element according to an embodiment.

Referring to FIG. 9A, firstly, semiconductor chips 120 are mounted on a substrate 110. The semiconductor chips 120 may be electrically connected to conductive wiring formed in the substrate 110 through, for example, bonding wires 130. In detail, the semiconductor chips 120 may be mounted on the substrate 110 first. Then, for an electric connection between the semiconductor chips 120 and the substrate 110, conductive pads 112 arranged on the top surface 111 of the substrate 110 and chip conductive pads 122 arranged on the top surface of the semiconductor chips 120 may be connected to each other via the bonding wires 130. External connection pads 114 may be arranged on the bottom surface 113 of the substrate 110.

Referring to FIG. 9B, the substrate 110 with the semiconductor chips 120 formed thereon is provided on a first sealing substrate 210, whereas the lattice element 140 is provided on a second sealing substrate 220 facing the first sealing substrate 210. The lattice element 140 facing the semiconductor chips 120 may be located on the substrate 110. A support of the lattice element 140 contacts the substrate 110 with the semiconductor chips 120 facing the lattice element 140. The lattice element 140 may include a plurality of bodies.

The lattice element 140 may be attached and fixed to the second sealing substrate 220 via attachment holes formed in the bodies. In other words, the lattice element 140 may be arranged to the second sealing substrate 220. The first sealing substrate 210 and the second sealing substrate 220 can be used when operations for injecting a molding resin are sequentially performed.

Referring to FIG. 9C, a molding element 150 may be arranged on the substrate 110 to encapsulate the semiconductor chips 120 and the lattice element 140 between the first sealing substrate 210 and the second sealing substrate 220. In detail, a molding resin, such as an epoxy resin, is injected using, for example, a transferring molding process, and cured. After the molding element 150 is cured via a curing operation, the first sealing substrate 210 and the second sealing substrate 220 are removed. Solder balls (116, refer to FIG. 5) are attached to the external connection pads 114 arranged on the bottom surface 113 of the substrate 110, thereby completing the semiconductor package (20, refer to FIG. 5).

FIG. 10 is a diagram showing a semiconductor package including a lattice element according to some embodiments.

Referring to FIG. 10, in a semiconductor package 30 according to an embodiment, the semiconductor chips 120 may be electrically connected to the substrate 110 via solder ball bonding, where the lattice element 140 may be included inside the molding element 150. Same as the semiconductor packages 10 and 20 described above, the semiconductor package 30 according to an embodiment includes the substrate 110, the semiconductor chip 120 arranged on the semiconductor chips 120, the molding element 150 arranged on the substrate 110 and encapsulating the semiconductor chips 120, and the lattice element 140 arranged inside the molding element 150. If the semiconductor chips 120 are mounted via solder ball bonding, the semiconductor chips 120 are attached to the top surface of the substrate 110 via chip bonding solder balls 135, where the semiconductor chips 120 and the substrate 110 are electrically connected to each other via the chip bonding solder balls 135. For example, a first end of the chip bonding solder ball 135 is connected to the conductive pad 112 arranged on the top surface 111 of the substrate 110 and a second end of the chip bonding solder ball 135 is connected to the chip conductive pad 122 arranged on the bottom surface 113 of the semiconductor chip 120, and thus the semiconductor chip 120 and the substrate 110 may be electrically connected to each other. The plurality of external connection pads 114 may be arranged on the bottom surface 113 of the substrate 110, and the solder balls 116 may be respectively attached to the plurality of external connection pads 114. Since these components are same as those described above, detailed descriptions thereof will be omitted.

Figure 11:
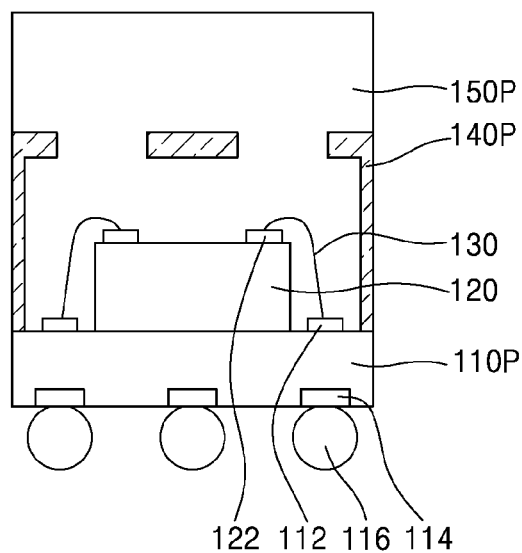
FIG. 11 is a cross-sectional diagram showing a singulated semiconductor package after a singulation process according to some embodiments.

FIG. 11 is a cross-sectional view showing a single semiconductor package after a semiconductor package including a lattice element is diced, i.e. singulated.

Referring to FIG. 11, the semiconductor package (10 of FIG. 2) in which the plurality of semiconductor chips (120, see FIG. 2) are mounted on the substrate (110, see FIG. 2) and encapsulated by the molding element (150, see FIG. 2) is finally fabricated as a single semiconductor package 10P in a dicing operation. The dicing operation is performed along a dicing lane.

As shown in FIG. 11, the single semiconductor package 10P includes the semiconductor chip 120 mounted on a portion 110P of the substrate 110, the bonding wire 130 that electrically connects the semiconductor chip 120 to conductive patterns including conductive pads 112 formed in the portion 110P of the substrate 110, a portion 150p of the molding element 150 that encapsulates the semiconductor chip 120, and a portion 140P of the lattice element 140 arranged inside the portion 150p of the molding element 150. The plurality of external connection pads 114 may be arranged on the bottom surface 113 of the portion 110P of the substrate 110, and the solder balls 116 may be respectively attached to the plurality of external connection pads 114.

Here, the single semiconductor chip 120 may be surrounded by the portion 140P of the lattice element 140. A support of the portion 140P of the lattice element 140 may contact the portion 110P of the substrate 110 to be electrically connected thereto. In other words, the single semiconductor package 10P may be configured to include at least one support around the semiconductor chip 120.

Figure 12:
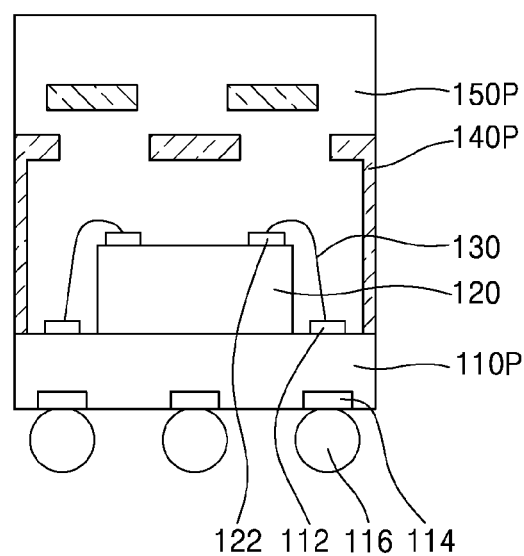
FIG. 12 is a cross-sectional diagram showing a singulated semiconductor package after a singulation process according to some embodiments.

FIG. 12 is a cross-sectional view showing a singulated semiconductor package according to some embodiments.

Referring to FIG. 12, the semiconductor package (20 of FIG. 5) in which the plurality of semiconductor chips (120, see FIG. 5) are mounted on the substrate (110, see FIG. 5) and encapsulated by the molding element (150, see FIG. 5) is finally fabricated as a single semiconductor package 20P in a dicing operation.

The single semiconductor package 20P includes the semiconductor chip 120 mounted on the portion 110P of the substrate 110, the bonding wire 130 that electrically connects the semiconductor chip 120 to the portion 110P of the substrate 110, the portion 150p of the molding element 150 that encapsulates the semiconductor chip 120, and the portion 140P of the lattice element 140 arranged inside the portion 150p of the molding element 150 and including a plurality of bodies. The plurality of external connection pads 114 may be arranged on the bottom surface 113 of the portion 110P of the substrate 110, and the solder balls 116 may be respectively attached to the plurality of external connection pads 114. Since the remaining components of the semiconductor package 20P are identical to those of the semiconductor package 10P described above, detailed descriptions thereof will be omitted.

As discussed above, the warpage suppressing structure of the present disclosure has been described as being a lattice element. However, the present inventive concepts may be applied to any skeletal or open framework structure that can be disposed within a molding element of a semiconductor package to suppress the thermal expansion and thermal contraction of the molding element. In some embodiments, such a skeletal or open framework structure may be of a plate-like structure (or a plate) having openings extending therethrough. The plate-like structure may have blocks of a molding compound disposed in corresponding ones of the openings formed in the plate-like structure. In some embodiments, such a plate-like structure may be supported by supports extending between a top surface of a package substrate and a bottom surface of the plate-like structure. Other frameworks could also provide the intended benefits of the present inventive concepts. For instance, a rigid framework of intersecting bars or rods could provide the desired internal support for resisting warpage. Further, the openings formed in the plate-like structure may not be arranged in a regular pattern, but may instead be arranged in an irregular pattern along the plate-like structure.

Figure 13:
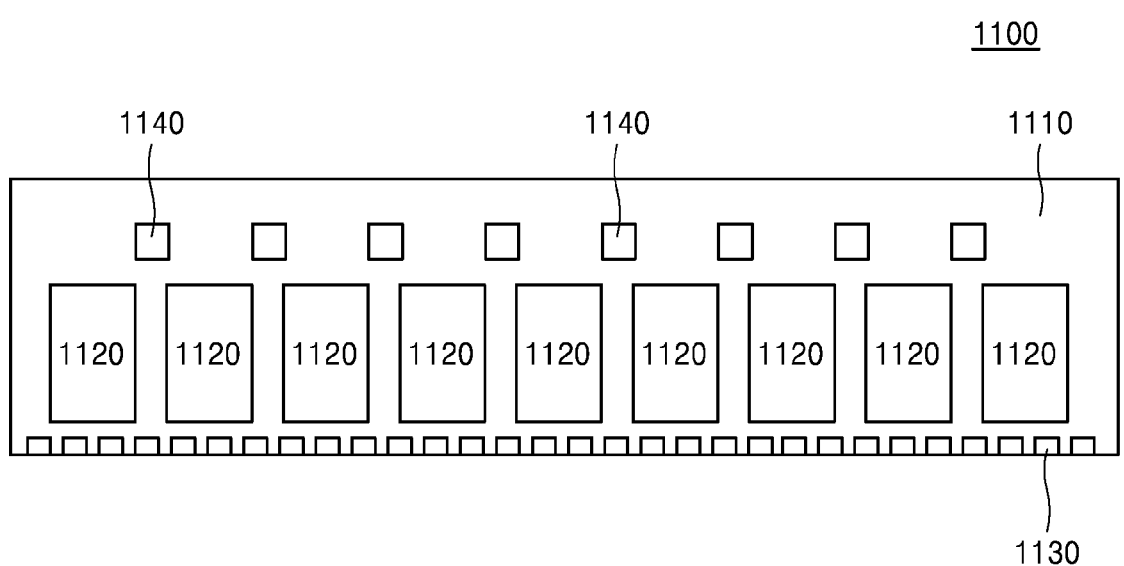
FIG. 13 is a plan view of a semiconductor module including a semiconductor package according to an embodiment.

FIG. 13 is a plan view of a semiconductor module including a semiconductor package according to some embodiments.

Referring to FIG. 13, a memory module 1100 includes a module substrate 1110 and a plurality of semiconductor packages 1120 attached to the module substrate 1110.

The plurality of semiconductor packages 1120 may include semiconductor packages according to some embodiments. For example, the plurality of semiconductor packages 1120 may include the semiconductor packages 10, 20, and/or 30 as shown in FIG. 2, FIG. 5, and/or FIG. 10. Therefore, the memory module 1100 including the thin and reliable semiconductor packages 10, 20, and 30 is provided.

A connector 1130, which may be inserted to a socket of a mainboard, is arranged at an end of the module substrate 1110. Ceramic decoupling capacitors 1140 are arranged on the module substrate 1110. However, the configuration of the module substrate 1110 is not limited to the configuration exemplified in FIG. 13 and the module substrate 1110 may be fabricated to have various other configurations.

Figure 14:
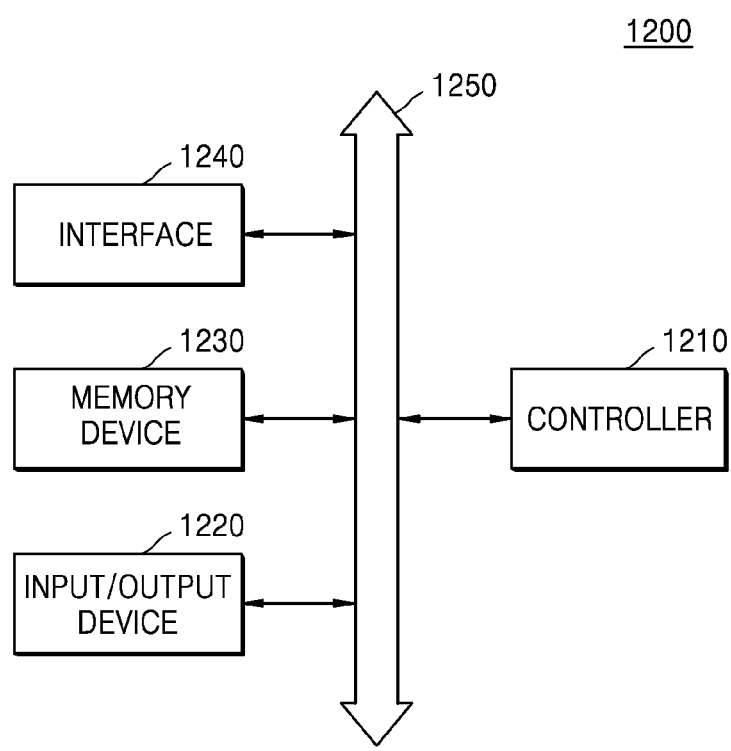
FIG. 14 is a diagram showing a configuration of a system including a semiconductor package fabricated based on a method of fabricating a semiconductor package according to an embodiment.

FIG. 14 is a diagram showing the configuration of a system including a semiconductor package fabricated based on a method of fabricating a semiconductor package according to an embodiment.

Referring to FIG. 14, a system 1200 includes a controller 1210, an input/output device 1220, a memory device 1230, and an interface 1240.

The system 1200 may be a mobile system or a system for transmitting or receiving data. According to some embodiments, the mobile system may be a personal digital assistant (PDA), a portable computer, a web tablet, a wireless phone, a mobile phone, a digital music player, or a memory card.

The controller 1210 may be a component for controlling programs executed on the system 1200 and may consist of a microprocessor, a digital signal processor, a microcontroller, or the like.

The input/output device 1220 may be used to input or output data to or from the system 1200. The system 1200 may be connected to an external device, e.g., a personal computer or a network, via the input/output device 1220 and exchange data with the external device. For example, the input/output device 1220 may be a keypad, a keyboard, or a display.

The memory device 1230 may store codes and/or data for operations of the controller 1210 or may store data processed by the controller 1210. The memory device 1230 may include a semiconductor package according to an embodiment. For example, the memory device 1230 may include the semiconductor packages 10, 20, and/or 30 as shown in FIG. 2, FIG. 5, and/or FIG. 10. Therefore, the memory device 1230 including the thin and reliable semiconductor packages 10, 20, and 30 is provided.

The interface 1240 may be a data transmission path between the system 1200 and an external device. The controller 1210, the input/output device 1220, the memory device 1230, and the interface 1240 may communicate with one another via a bus 1250.

The system 1200 may be used in mobile phones, MP3 players, navigation devices, portable multimedia players (PMP), solid-state disks (SSD), or household appliances.

Figure 15:
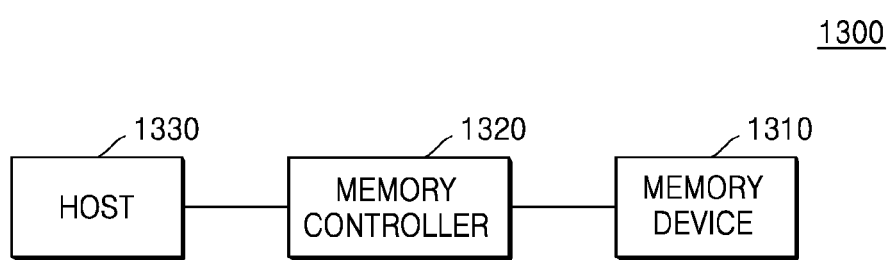
FIG. 15 is a diagram showing a configuration of a memory card including a semiconductor package fabricated based on a method of fabricating a semiconductor package according to an embodiment.

FIG. 15 is a diagram showing the configuration of a memory card including a semiconductor package fabricated based on a method of fabricating a semiconductor package according to an embodiment.

Referring to FIG. 15, a memory card 1300 includes a memory device 1310 and a memory controller 1320.

The memory device 1310 may store data. According to some embodiments, the memory device 1310 has non-volatile property for retaining stored data even if power supply is interrupted. The memory device 1310 may include a semiconductor package according to an embodiment. For example, the plurality of memory device 1310 may include the semiconductor packages 10, 20, and/or 30 as shown in FIG. 2, FIG. 5, and/or FIG. 10. Therefore, the memory device 1310 including the thin and reliable semiconductor packages 10, 20, and 30 is provided.

The memory controller 1320 may read out data stored in the memory device 1310 or store data in the memory device 1310 in response to read/write requests of a host 1330.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
a substrate;
at least one semiconductor chip mounted on the substrate;
a molding element encapsulating the at least one semiconductor chip; and
a lattice element arranged inside the molding element,
wherein the lattice element comprises a body, a plurality of openings defined by the body and a plurality of supports extending from the substrate to the body,
wherein the body of the lattice element is stacked vertically on the at least one semiconductor chip,
wherein the plurality of supports are separated from each other, and
wherein one of the plurality of supports is disposed between two adjacent openings of the plurality of openings in a plane view.

2. The semiconductor package of claim 1,
wherein the lattice element comprises a conductive material, and
wherein the plurality of supports are electrically connected to the substrate.

3. The semiconductor package of claim 1,
wherein the plurality of openings is defined by first ribs and second ribs that intersect with each other substantially perpendicularly, and
wherein the plurality of supports are in contact with the body.

4. The semiconductor package of claim 1,
wherein the plurality of openings exist in an area between adjacent supports in a plane view.

5. The semiconductor package of claim 4,
wherein an area of each of the openings is smaller than an area of a top surface of the at least one semiconductor chip.

6. The semiconductor package of claim 1,
wherein a material of the lattice element has a mechanical strength greater than a material of the molding element, and
wherein the material of the lattice element includes metal.

7. The semiconductor package of claim 1,
wherein a distance between a top surface of the substrate to the body is greater than a distance between the top surface of the substrate to the at least one semiconductor chip.

8. A semiconductor package comprising:
a substrate;
a plurality of semiconductor chips mounted on the substrate;
a molding element encapsulating the plurality of semiconductor chips; and
a lattice element arranged inside the molding element,
wherein the lattice element comprises:
a first body, a plurality of first openings defined by the first body, and a plurality of first supports extending from the first body to the substrate; and a second body, a plurality of second openings defined by the second body, and a plurality of second supports extending from the second body to the first body, wherein the first body and the second body are stacked vertically on the plurality of semiconductor chips, and wherein the first body is interposed between the second body and the plurality of semiconductor chips.

9. The semiconductor package of claim 8,
wherein the first body and second body are spaced apart from each other, overlapped vertically each other and are substantially parallel to the substrate.

10. The semiconductor package of claim 9,
wherein each of the plurality of first openings of the first body and each of the second openings of the second body are non-overlapped.

11. The semiconductor package of claim 9,
wherein each of the plurality of first openings of the first body and each of plurality of second openings of the second body have substantially the same size.

12. The semiconductor package of claim 8,
wherein at least one of the plurality of first supports is disposed between two adjacent semiconductor chips of the plurality of semiconductor chips.

13. The semiconductor package of claim 8,
wherein the plurality of second supports is in contact with the first body,
wherein the plurality of second supports is higher than a top surface of each of the plurality of semiconductor chips.

14. A semiconductor package comprising:
a substrate;
at least one semiconductor chip mounted on the substrate;
a molding element encapsulating the at least one semiconductor chip; and
a plurality of plates comprising a first plate and a second plate, each of the plurality of plates having a plurality of openings extending therethrough being disposed inside the molding element, the plurality of plates overlying the at least one semiconductor chip; and
a plurality of first supports extending between the substrate the first plate; and
a plurality of second supports extending between the first plate and the second plate,
wherein the first plate and the second plate are stacked vertically on the at least one semiconductor chip, and
wherein the first plate is interposed between the second plate and the at least one semiconductor chip.

15. The semiconductor package of claim 14,
wherein the molding element includes a plurality of blocks each disposed within one of the plurality of openings.

16. The semiconductor package of claim 14,
wherein the plurality of openings comprises a plurality of first openings defined by the first plate and a plurality of second openings defined by the second plate, and
wherein each of the plurality of first openings and each of the plurality of second openings are alternately arranged in a plane view.

17. The semiconductor package of claim 16,
wherein each of the plurality of first openings and each of the plurality of second openings are offset from each other in a plane view.

18. The semiconductor package of claim 16,
wherein the first openings are arranged in a first checkerboard pattern and the second openings are arranged in a second checkerboard-type pattern, and wherein the first checkerboard pattern is offset from the second checkerboard-type pattern in a plane view.

\* \* \* \* \*